(12) United States Patent
Jindo et al.

(10) Patent No.: US 11,259,396 B2
(45) Date of Patent: Feb. 22, 2022

(54) PLASMA GENERATION SYSTEM

(71) Applicant: FUJI CORPORATION, Chiryu (JP)

(72) Inventors: Takahiro Jindo, Anjo (JP); Toshiyuki Ikedo, Nagoya (JP)

(73) Assignee: FUJI CORPORATION, Chiryu (JP)

( * ) Notice: Subject to any disclaimer, the term of this patent is extended or adjusted under 35 U.S.C. 154(b) by 275 days.

(21) Appl. No.: 16/499,467

(22) PCT Filed: Apr. 4, 2017

(86) PCT No.: PCT/JP2017/014090
§ 371 (c)(1),
(2) Date: Sep. 30, 2019

(87) PCT Pub. No.: WO2018/185835
PCT Pub. Date: Oct. 11, 2018

(65) Prior Publication Data
US 2020/0060017 A1   Feb. 20, 2020

(51) Int. Cl.
*H05H 1/00*       (2006.01)
*H01J 37/32*      (2006.01)
*H05H 1/34*       (2006.01)

(52) U.S. Cl.
CPC ......... *H05H 1/34* (2013.01); *H01J 37/32192* (2013.01); *H01J 37/32522* (2013.01); *H01J 37/32568* (2013.01)

(58) Field of Classification Search
CPC .. H05H 1/00; H05H 1/24; H05H 1/26; H05H 1/30; H05H 1/34; H01J 37/3244;
(Continued)

(56) References Cited

U.S. PATENT DOCUMENTS 6,475,563 B2 * 11/2002 Hayakawa .............. C23C 16/20
                                                    118/715
10,443,139 B2 * 10/2019 Mills ....................... H02S 10/10
(Continued)

FOREIGN PATENT DOCUMENTS

JP        3-192697 A       8/1991
JP     2005-194599 A       7/2005
(Continued)

OTHER PUBLICATIONS

International search report dated Jul. 11, 2017 in PCT/JP2017/014090 filed on Apr. 4, 2017.

*Primary Examiner* — Haissa Philogene
(74) *Attorney, Agent, or Firm* — Oblon, McClelland, Maier & Neustadt, L.L.P.

(57) ABSTRACT

A plasma generation system capable of more accurately measuring the actual temperature of a plasma gas applied to a target object. The plasma generation system includes: an emitting head configured to generate plasma gas by supplying power to electrodes provided in a reaction chamber to generate a plasma gas by converting a processing gas into plasma, and apply the generated plasma gas to a target object; and a temperature sensor configured to detect a temperature of the plasma gas and output a detection signal corresponding to the detected temperature. The temperature sensor is arranged at a position separated from an emission port of the emitting head from which the plasma gas is emitted. The emitting head is configured to be movable between the target object the temperature sensor.

6 Claims, 5 Drawing Sheets

(58) Field of Classification Search
CPC ........... H01J 37/32458; H01J 37/32532; H01J 37/32568; H01J 37/32192; C23C 16/452; C23C 16/4557
See application file for complete search history.

(56) References Cited

U.S. PATENT DOCUMENTS

| | | | |
|---|---|---|---|
| 10,980,101 B2* | 4/2021 | Niwa | C23C 16/513 |
| 2008/0053988 A1 | 3/2008 | Arai et al. | |
| 2014/0263181 A1* | 9/2014 | Park | C23C 16/0245 |
| | | | 216/68 |
| 2016/0273110 A1 | 9/2016 | Sanda et al. | |

FOREIGN PATENT DOCUMENTS

| | | | |
|---|---|---|---|
| JP | 2008-59838 A | 3/2008 |
| JP | 2008-59839 A | 3/2008 |
| JP | 2015-111544 A | 6/2015 |
| JP | 2016-172889 A | 9/2016 |
| WO | WO 2016/194138 A1 | 12/2016 |

* cited by examiner

PLASMA GENERATION SYSTEM

TECHNICAL FIELD

The present application relates to a plasma generation system for generating a plasma gas by converting a processing gas into plasma.

BACKGROUND ART

In a plasma generation system, a processing gas is supplied to a reaction chamber, and electric power is supplied to multiple electrodes arranged in the reaction chamber. As a result, electrical discharge occurs in the reaction chamber, and the processing gas is converted into plasma, thereby generating plasma gas. As an example of this type of plasma generation system, a system for generating plasma gas using microwaves is described in the following patent literature.

In the plasma generation system disclosed in patent literature 1, plasma gas is emitted from a circular emission port by generating a glow discharge between an inner electrode and an outer electrode arranged concentrically to generate plasma and supplying a processing gas between the electrodes. An adapter for converting a circular emission port into a longitudinal emission port is mounted on the end of the nozzle for emitting the plasma gas. A temperature sensor is provided on a side surface of the converting adapter in a longitudinal direction. The plasma generation system adjusts the amount of gas supplied to the nozzle and the length of the waveguide based on detection results of the temperature sensor.

CITATION LIST

Patent Literature

Patent literature 1: JP-A-2008-59838

BRIEF SUMMARY

Technical Problem

The temperature of the plasma gas changes depending on the environment in which the plasma generation system is used. Therefore, the temperature of the plasma gas applied to the target object changes as it goes from the nozzle to the target object. It is therefore an object of the present disclosure to provide a plasma generation system capable of more accurately measuring the actual temperature of a plasma gas applied to a target object.

Solution to Problem

Disclosed herein is a plasma generation system including: an emitting head configured to generate plasma gas by supplying power to electrodes provided in a reaction chamber to generate a plasma gas by converting a processing gas into plasma, and apply the generated plasma gas to a target object; and a temperature sensor configured to detect a temperature of the plasma gas and output a detection signal corresponding to the detected temperature, wherein the temperature sensor is arranged at a position separated from an emission port of the emitting head from which the plasma gas is emitted, and the emitting head is configured to be movable between the target object the temperature sensor.

Advantageous Effects

According to technology disclosed in the present application, even when a room temperature or the like changes in accordance with the environment in which the plasma generation system is used, the actual temperature of the plasma gas applied to the target object can be measured more accurately.

DESCRIPTION OF EMBODIMENTS

Hereinafter, an embodiment of a plasma generation system of the present application will be described in detail with reference to FIGS. 1 to 5.

(A) Plasma Generation System 10

Figure 1:
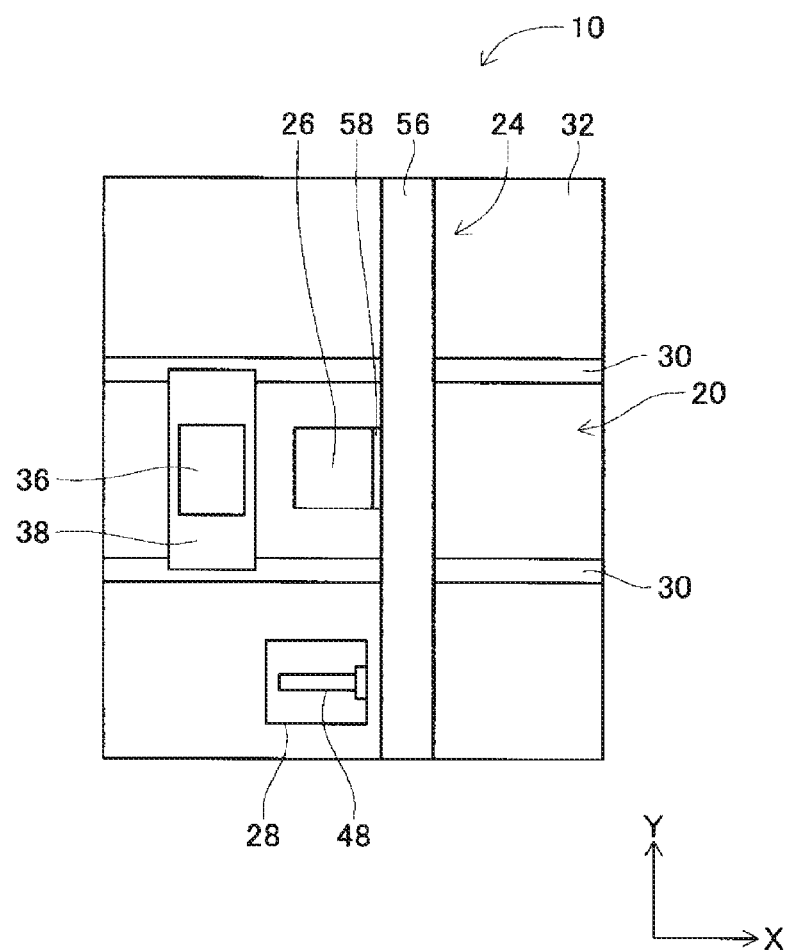
FIG. 1 is a plan view showing a plasma generation system.

FIG. 1 shows a plan view of an embodiment, plasma generation system 10. Plasma generation system 10 of the present embodiment is a system for emitting plasma generated under atmospheric pressure to target object 36. In the following description, as shown in FIG. 1, the direction in which target object 36 is conveyed is referred to as the X direction, and the horizontal direction orthogonal to the X direction is referred to as the Y direction.

Figure 5:
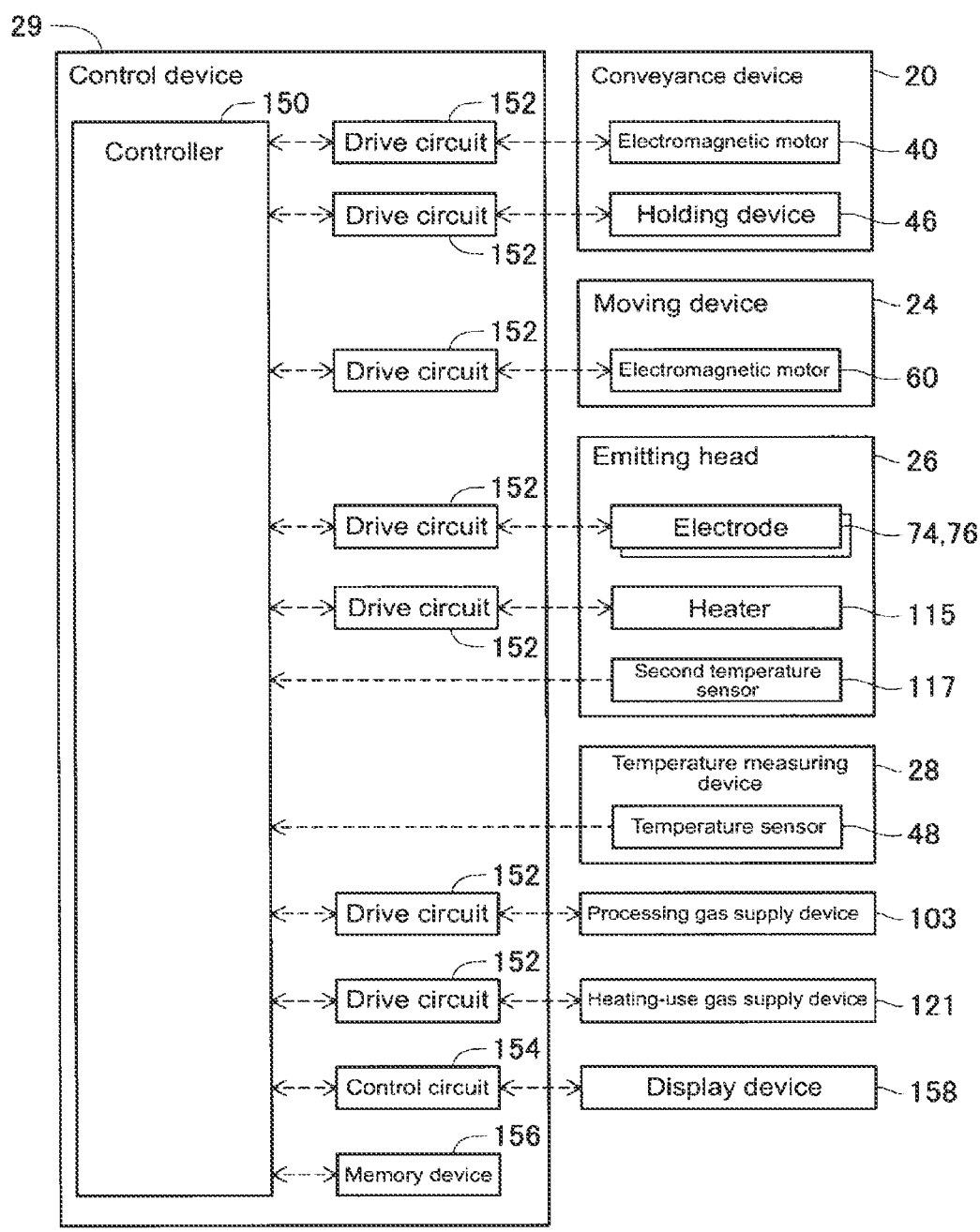
FIG. 5 is a block diagram of the plasma generation system.

As shown in FIG. 1, plasma generation system 10 includes conveyance device 20, moving device 24, emitting head 26, temperature measuring device 28, and control device 29 (see FIG. 5). Conveyance device 20 includes a pair of conveyor belts 30. The pair of conveyor belts 30 are arranged on base 32 so as to be parallel to each other and extend in the X-direction. The pair of conveyor belts 30 support loading plate 38 on which target object 36 is loaded, and convey loading plate 38 in the X-direction by being driven by electromagnetic motor 40 (refer to FIG. 5). The pair of conveyor belts 30 load loading plate 38 from, for example, a device upstream of plasma generation system 10 in the production line. Further, conveyance device 20 includes holding device 46 (refer to FIG. 5), and loading plate 38 supported by conveyor belts 30 is fixedly held in a work position approximately in a center section of base 32 by holding device 46. When the plasma processing at the work position is completed, the pair of conveyor belt 30 unloads loading plate 38 to a downstream-side device.

Moving device 24 includes beam section 56 and slider 58. Beam section 56 is mounted on base 32 and is arranged over the pairs of conveyor belts 30. Slider 58 is slidably held on a side surface of beam section 56 in the Y direction, and slides to any position in the Y direction by the driving of electromagnetic motor 60 (see FIG. 5).

Emitting head 26 is mounted on a side surface of slider 58, and is moved in the Y direction above base 32. Here, emitting head 26 is moved between a position above which the temperature is measured by temperature measuring device 28 and a position above loading plate 38 (target object 36) held by holding device 46 of conveyance device 20. The detailed configuration of emitting head 26 will be described later.

Temperature measuring device 28 is a device for measuring the temperature of the plasma gas emitted from emitting head 26, and is arranged at an end section of base 32 in the Y direction. Temperature measuring device 28 includes temperature sensor 48 for measuring the temperature of the plasma gas. Temperature sensor 48 is, for example, a thermocouple sensor, and is arranged above base 32 on which temperature measuring device 28 is arranged. Temperature measuring device 28 is configured to be detachable from plasma generation system 10 (control device 29), for example, and has an interface conforming to the Ethernet (registered trademark) standard or the RS-232C standard as an interface connected to control device 29. Note that, temperature sensor 48 is not limited to a thermocouple sensor, and may be another sensor capable of measuring the temperature of the plasma gas, for example, a thermistor, an infrared-ray sensor, or the like.

(B) Emitting Head 26

Figure 2:
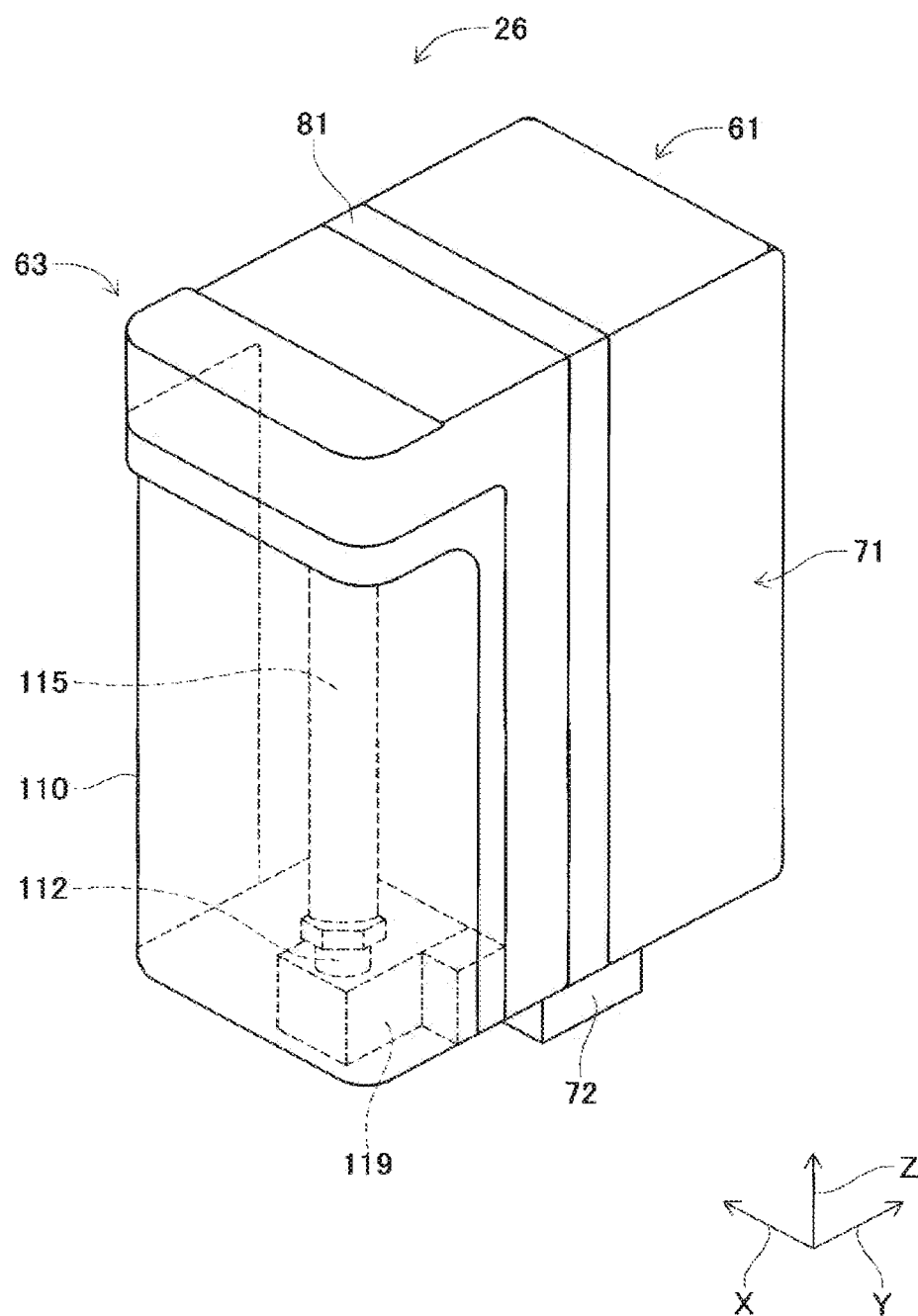
FIG. 2 is a perspective view of an emitting head from diagonally above.
Figure 3:
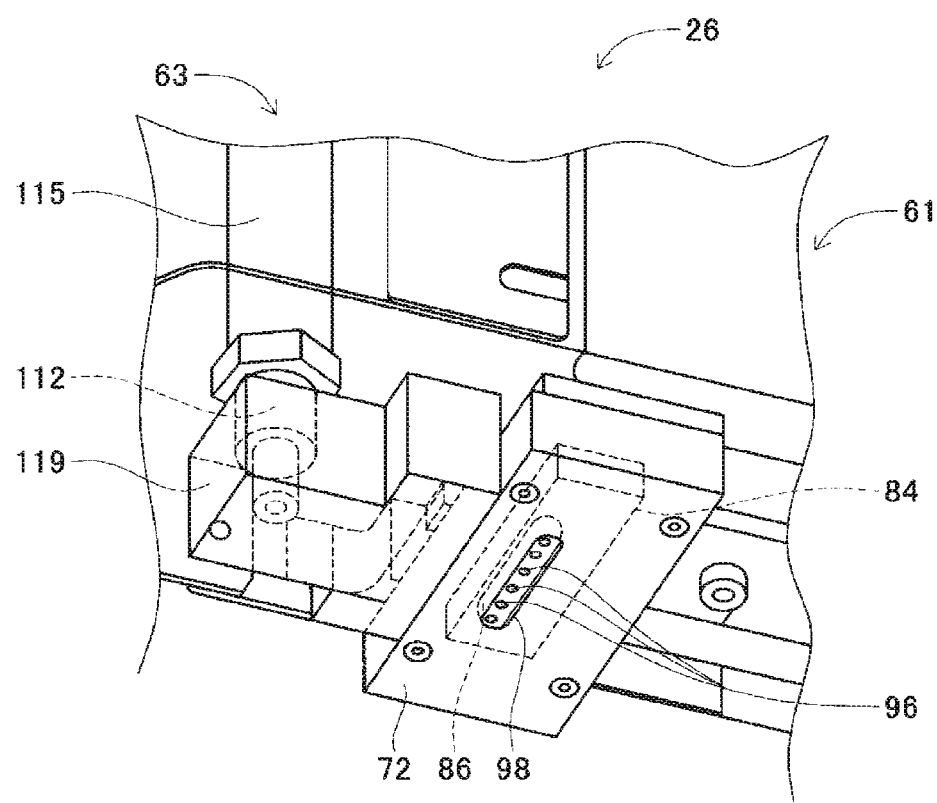
FIG. 3 is a perspective view of a lower section of the emitting head from diagonally below.
Figure 4:
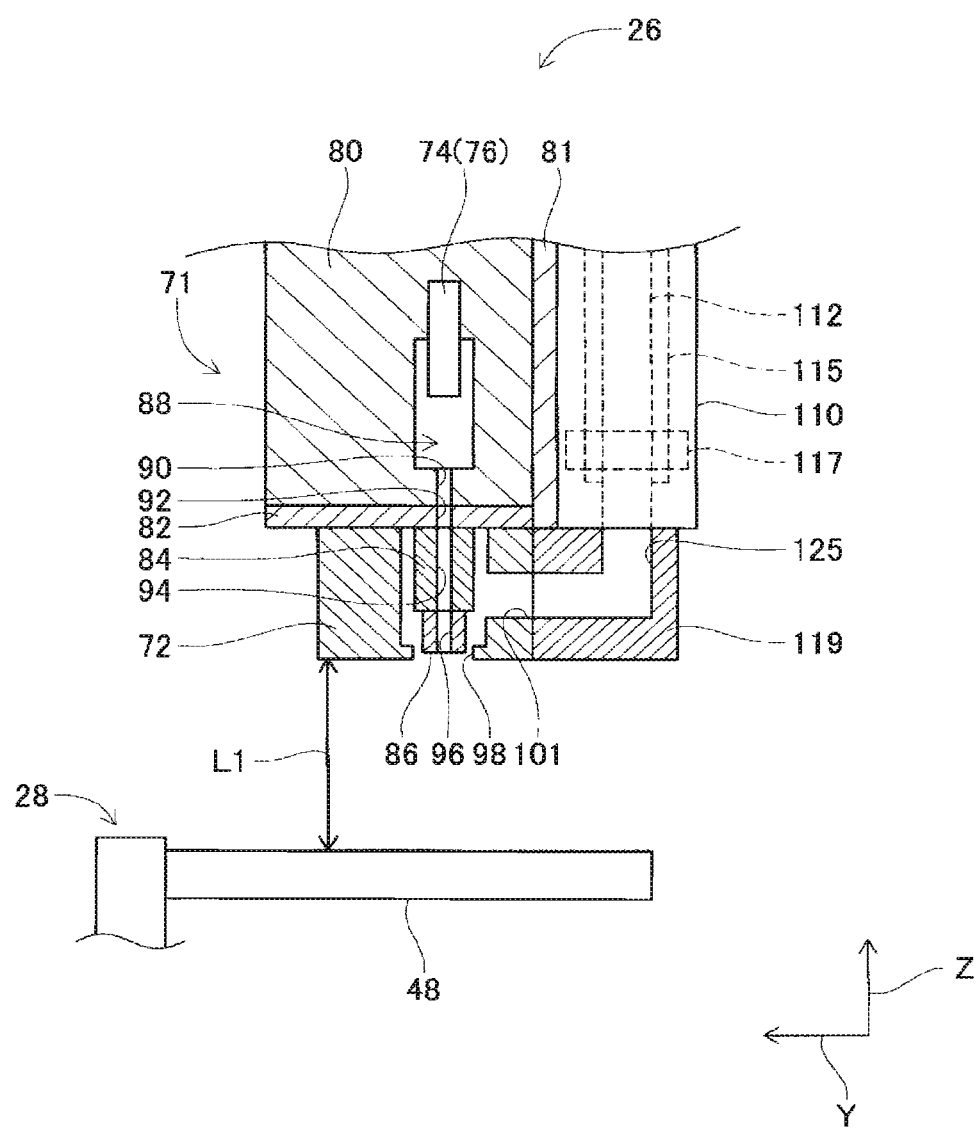
FIG. 4 is a cross section of a section of the emitting head.

Next, a detailed configuration of emitting head 26 will be described referring to FIGS. 2 to 4. Emitting head 26 is a device for generating plasma at atmospheric pressure, and includes plasma gas emitting device 61 and heated gas emitting device 63. Note that, FIG. 2 is a perspective view of emitting head 26 from diagonally above. FIG. 3 is a perspective view of a lower end section of emitting head 26 from diagonally below. FIG. 4 is a cross section of a section of emitting head 26. Further, in descriptions below, as shown in FIGS. 2 to 4, the widthwise direction of emitting head 26 is referred to as the X direction, the depth direction of emitting head 26 is referred to as the Y direction, the direction perpendicular to the X direction and the Y direction, that is, the vertical direction, is referred to as the Z direction.

Plasma gas ejecting device 61 is provided with housing 71, cover 72, and pair of electrodes 74 and 76. Housing 71 includes main housing 80, heat dissipation plate 81, earth plate 82, lower section housing 84, and nozzle block 86. Main housing 80 is roughly block-shaped, and reaction chamber 88 is formed inside main housing 30. Multiple first gas flow paths 90 (only one first gas flow path is shown in FIG. 4) are formed in main housing 80 so as to extend in the vertical direction, and the multiple first gas flow paths 90 are arranged at predetermined intervals in the X direction. The upper end of the respective first gas paths 90 opens to reaction chamber 88 and the lower end opens to the bottom surface of main housing 80.

Heat dissipation plate 81 is arranged on a side surface of main housing 80 in the Y direction. Heat dissipation plate 81 includes multiple fins (not shown) that dissipate heat of main housing 80. Also, earth plate 82 functions as a grounding rod and is fixed to a lower surface of main housing 80. Grounding plate 82 is formed with multiple vertically penetrating through-holes 92 corresponding to the multiple first gas flow paths 90. Each through-hole 92 is connected to a corresponding first gas flow path 90.

Lower section housing 84 is block-shaped and is fixed to a lower surface of earth plate 82. In lower section housing 84, multiple second gas flow paths 94 are formed so as to extend vertically corresponding to the multiple through-holes 92. The upper end of each second gas flow path 94 is connected to a corresponding through-hole 92. The lower end of second gas flow path 94 opens to the bottom surface of lower section housing 84.

Nozzle block 86 is fixed to a lower surface of lower section housing 84, and multiple third gas flow paths 96 are formed extending vertically corresponding to the multiple second gas flow paths 94 of lower section housing 84. The upper end section of each third gas flow paths 96 is connected to a corresponding second gas flow path 94, and the lower end section of each third gas path 96 opens at the lower surface of nozzle block 86.

Cover 72 is roughly square, and is arranged at the lower surface of earth plate 82 so as to cover lower section housing 84 and nozzle block 86. Emission port 98 is formed on the lower surface of cover 72. Emission port 98 is formed to vertically penetrate the lower surface of cover 72, opens to be larger than the lower surface of nozzle block 86, and is provided at a position corresponding to the lower surface of nozzle block 86. Also, through-hole 101 is formed extending in the Y direction in a side surface of cover 72 towards heated gas emitting device 63.

Further, pair of electrodes 74 and 76 are arranged facing each other inside reaction chamber 88 of main housing 80. Processing gas supply device 103 (refer to FIG. 5) is connected to reaction chamber 88. Processing gas supply device 103 is a device for supplying at least one of an inert gas such as nitrogen and an active gas such as oxygen as a processing gas. By this, processing gas is supplied to reaction chamber 88.

Heated gas emitting device 63 includes protective cover 110, gas tube 112, heater 115, second temperature sensor 117, and connecting block 119. Protective cover 110 is arranged to cover heat dissipation plate 81 of plasma gas emitting device 61. Gas tube 112 is arranged inside protective cover 110 so as to extend in the vertical direction. Heating-use gas supply device 121 (refer to FIG. 5) is connected to gas tube 112. Heating-use gas supply device 121 is a device for supplying an active gas such as oxygen or an inert gas such as nitrogen.

Substantially cylindrical heater 115 is arranged on the outer peripheral surface of gas tube 112. Gas tube 112 is heated by heater 115. As a result, gas supplied from heating-use gas supply device 121 to gas tube 82 is heated. Further, second temperature sensor 117 for detecting the temperature of heater 115 is arranged inside protective cover 110. Second temperature sensor 117 outputs a detection signal (second detection signal) corresponding to the detected temperature of heater 115 to control device 29 (refer to FIG. 5). Second temperature sensor 117 may be, for example, a thermocouple sensor, a thermistor, or an infra-red sensor.

Connecting block 119 is connected to the lower end of gas tube 112, and is fixed to a side surface of cover 72 in the Y direction towards heated gas emitting device 63. Connecting block 119 is formed with connecting passage 125 bent in a generally L-shape. One end of connecting passage 125 opens to the upper surface of connection block 119, and the other end of connecting passage 125 opens to the side surface of plasma gas emitting device 61 in the Y-direction. Also, an end section of connecting passage 125 is connected to gas tube 82, and the other end section of connecting passage 125 is connected to through-hole 101 of cover 72.

(C) Control Device 29

Next, control device 29 included in plasma generation system 10 will be described. As shown in FIG. 5, control device 29 includes controller 150, multiple drive circuits 152, control circuit 154, and memory device 156. The multiple drive circuits 152 are connected to conveyance device 20, moving device 24, emitting head 26, temperature measuring device 28, processing gas supply device 103, heating-use gas supply device 121, and the like. Controller 150 is provided with a CPU, ROM, RAM, and so on, is formed mainly from a computer, and is connected to the multiple drive circuits 152. As a result, operation of emitting head 26, temperature measuring device 28, and the like is controlled by controller 150. Further, controller 150 is connected to display device 158 via control circuit 154.

Display device 158 is, for example, a touchscreen panel, and includes a liquid crystal panel, a light source such as LEDs for emitting light from the rear surface of the liquid crystal panel, a touch-sensitive film bonded to the surface of the liquid crystal panel, and the like. Thus, controller 150 can display various types of information on display device 158. In addition, controller 150 can receive instructions from a user via display device 158. Further, controller 150 is connected to memory device 156. As a result, various data are stored in memory device 156.

Also, temperature sensor 48 of temperature measuring device 28 is connected to controller 150. Thus, controller 150 can detect the temperature of the plasma gas based on the detection signal of temperature sensor 48. Controller 150 can determine whether the temperature of the plasma gas is an allowable temperature based on the temperature detected by temperature sensor 48.

Second temperature sensor 117 of emitting head 26 is connected to controller 150. As a result, controller 150 can detect the temperature of heater 115 based on the detection signal (second detection signal) of second temperature sensor 117. Controller 150 controls the electric power supplied to heater 115 based on the temperature detected by second temperature sensor 117, and can thus control the temperature of heater 115.

(D) Plasma Processing by Plasma Generation System 10

In plasma generation system 10 of the present embodiment, plasma is applied to target object 36 by the above-described configuration, such that plasma processing is performed on target object 36. As plasma processing, for example, surface modification of target object 36 is performed. In surface modification by plasma processing, the surface of target object 36 is chemically modified and a hydrophilic group is added to the surface of target object 36, thereby improving the wettability. In addition, for example, by physically modifying the surface of target object 36 by temperature and high voltage, unevenness is formed on the surface of target object 36.

In plasma generation system 10 of the present embodiment, warmup operation is performed before plasma processing is started, and the temperature of the plasma gas is measured by temperature measuring device 28 during warmup operation to determine whether the temperature of the plasma gas is acceptable. More specifically, in plasma generation system 10 of the present embodiment, in plasma gas emitting device 61, processing gas is converted into plasma in reaction chamber 88 by supplying electric power to pair of electrodes 74 and 76 while the processing gas is supplied to reaction chamber 88. Then, the plasmarized gas, that is, the plasma gas, is emitted from the lower end of third gas flow path 96 of nozzle block 86. Further, heated gas heated by heated gas emitting device 63 is supplied inside cover 72. As a result, plasma gas is emitted from emission port 98 of cover 72 together with the heated gas, and target object is subjected to plasma processing.

The plasma gas is also protected by the heated gas. The plasma gas reacts with an active gas such as oxygen in the air, generating ozone. This means that there is a problem of the plasma gas deactivating and appropriate plasma processing not being performed. On the other hand, in plasma generation system 10 of the present embodiment, nozzle block 86 for emitting the plasma gas is covered by cover 72, and heated gas is supplied inside cover 72. As a result, when plasma gas is emitted from emission port 98 of cover 72, the heated gas is emitted together with the plasma gas so as to surround the emitted plasma gas. The heated gas is heated to, for example, 700° C. or higher by heater 115, and the heated gas emitted from emission port 98 is 250° C. or higher. Since ozone is decomposed at 200° C. or higher, ozonization of the plasma gas surrounded by the heating gas is suppressed. Thereby, deactivation of the plasma gas is suppressed, and plasma processing can be performed appropriately.

Here, in plasma generation system 10 of the present embodiment, it is possible to selectively perform plasma processing in either normal mode or standby mode. In the normal mode, for example, when the stop button displayed on display device 158 (touchscreen panel) is operated during plasma processing, the supply of electric power to electrodes 74 and 76, the supply of processing gas to reaction chamber 88, and the supply of heated gas by heated gas emitting device 63 are stopped. On the other hand, in the standby mode, when the stop button is operated during plasma processing, the supply of electric power to electrodes 74 and 76, and the supply of processing gas to reaction chamber 88 are stopped, but supply of heated gas by the heated gas emitting device 63 is continued. Note that, operation contents of the normal mode and the standby mode described above are only examples, and can be changed as appropriate. For example, in the standby mode, processing gas may not be supplied to reaction chamber 88.

Further, in plasma generation system 10 of the present embodiment, when the system is started to start plasma processing or when plasma processing is started from the normal mode described above, plasma gas emitting device 61 performs warmup operation before plasma processing is performed on target object 36. This is because, when plasma gas emitting device 61, in particular, reaction chamber 88 is not sufficiently warmed, the processing gas cannot be suitably converted into plasma in reaction chamber 88, meaning that the plasma generation capability is low.

For example, when the start button displayed on display device 158 (touchscreen panel) is operated in normal mode, controller 150 controls moving device 24 to move emitting head 26 above temperature measuring device 28. As shown in FIG. 4, emitting head 26 is arranged above temperature measuring device 28. Temperature sensor 48 of temperature measuring device 28 is arranged at a position separated in the Z-direction from emission port 98 of emitting head 26 from which the plasma gas is emitted. In this state, plasma gas is applied to temperature sensor 48 from emitting head 26.

Controller 150 controls processing gas supply device 103 to supply processing gas to reaction chamber 88. Controller 150 supplies processing gas to reaction chamber 88 while voltage is applied to pair of electrodes 74 and 76. Thus, an electrical discharge occurs between the pair of electrodes 74 and 76, and the processing gas is plasmarized by the electrical discharge. The generated plasma gas is applied to the lower temperature sensor 48. At this time, reaction chamber 88 is heated by the discharging. Further, controller 150 controls heating-use gas supply device 121 to supply heated gases heated by heater 115 inside cover 72. As a result, the plasma gas is heated by the heated gas. Heating by heater 115 also warms reaction chamber 88.

Controller 150 emits plasma gas (including heated gas) onto temperature sensor 48, and performs processing (detection processing) of measuring the temperature of the plasma gas. While measuring the temperature of the plasma gas, controller 150 determines whether the temperature of the plasma gas has reached an allowable temperature (for example, 160° to 170° C.). Thus, during warmup operation before plasma processing, the actual temperature of the plasma gas emitted from emitting head 26 can be measured more accurately without applying the plasma gas to target object 36. Further, the plasma gas is warmed to a predetermined allowable temperature, such that the plasma generating ability by plasma gas emitting device 61 is sufficiently enhanced.

In response to the determination that the temperature of the plasma gas has reached the allowable temperature, controller 150 moves emitting head 26 to the position of target object 36, and performs plasma processing (application processing). Here, for example, when warmup operation is performed for a predetermined time using timers or the like, it is difficult to confirm whether the temperature of the plasma gas emitted from emission port 98 is actually an allowable temperature. Further, the temperature of the emitted plasma gas changes in accordance with the temperature of the room in which plasma generation system 10 is used, for example, the set temperature of the air conditioner. Therefore, the temperature of processing gas applied to target object 36 changes from the temperature at emission port 98 to the temperature when reaching target object 36.

On the other hand, in plasma generation system 10 of the present embodiment, since plasma processing is performed on target object 36 after confirming that the temperature of the plasma gas after emission has reached the allowable temperature, the desired plasma processing can be performed on target object 36, and wettability and the like can be ensured. Note that, in the measurement of the temperature of the plasma gas described above, controller 150 may stop supplying the heated gas, and measure the temperature of only the processing gas using temperature sensor 48, so as to perform the determination. In this case, controller 150 may determine whether the temperature of the plasma gas is acceptable based on a temperature different from the allowable temperature for when the heated gas is supplied (for example, a lower temperature).

Further, controller 150 of the present embodiment performs detection processing of detecting the temperature by applying the plasma gas to temperature sensor 48, and application processing (plasma processing) of applying the plasma gas to target object 36 by controlling moving device 24 and moving emitting head 26 to the position of target object 36. Accordingly, it is possible to measure the temperature of the plasma gas by moving emitting head 26 to the position of temperature sensor 48 in accordance with operation sequences of plasma generation system 10 such as warmup operation.

Further, when measuring the temperature of the plasma gas, controller 150 sets reference distance L1, which is the distance between temperature sensor 48 and emitting head 26 shown in FIG. 4, to a distance based on the distance between target object 36 and emitting head 26 during plasma processing. Reference distance L1 is, for example, the distance between the opening of emission port 98 and the measured position of the temperature sensor 48. Further, reference distance L1 is, for example, substantially the same as the distance between the opening of emission port 98 and the upper surface of target 36 during plasma processing. Note that, reference distance L1 may be appropriately changed based on the distance between target object 36 and emitting head 26 during plasma processing.

Therefore, with plasma generation system 10 of the present embodiment, reference distance L1 between temperature sensor 48 and emitting head 26 when measuring the temperature of the plasma gas is set to be the same as the distance between target object 36 and emitting head 26 during the plasma processing, that is, the distance when actually applying the plasma gas to target object 36 to perform work. As a result, the temperature of the processing gas emitted from emission port 98, which changes during the period until the plasma gas reaches target object 36, can be measured more accurately. That is, even when the temperature, humidity, or the like in the chamber changes in accordance with the environment in which plasma generation system 10 is used, the temperature of the plasma gas applied to target object 36 can be measured more accurately.

Further, if the temperature of the plasma gas exceeds the allowable temperature, controller 150 may perform control to increase the distance (reference distance L1) between emitting head 26 and temperature sensor 48. By increasing reference distance L1, the temperature of the plasma gas in the air decreases greatly, such that the temperature of the plasma gas when applied to temperature sensor 48 decreases. Therefore, controller 150 may adjust the reference distance L1 by increasing reference distance L1 such that the temperature of the plasma gas applied to temperature sensor 48 becomes the allowable temperature. For example, controller 150 may store adjusted reference distances L1 in memory device 156. Controller 150 uses the adjusted reference distances L1 stored in memory device 156 in plasma processing. Controller 150 moves emitting head 26 above target object 36, sets the distance between target object 36 and emitting head 26 to the adjusted reference distance L1 read from memory device 156, and performs application of plasma gas to target object 36.

Here, for example, when the plasma processing is performed on a target object 36 manufactured of resin material, the control of the temperature of the plasma gas is particularly important. This is because a target object 36 manufactured of resin material is liable to be deformed or the like due to a temperature change. With respect to this point, with controller 150 of the present embodiment, when the temperature of the plasma gas exceeds the allowable temperature, reference distance L1 is adjusted to be longer, and plasma processing is performed at the adjusted reference distance L1. As a result, even when the temperature of plasma gas exceeds the allowable temperature, by increasing reference distance L1, it is possible to curtail the application of plasma gas exceeding the allowable temperature to target object 36, thereby curtailing thermal deformation of target object 36. Further, since it is not necessary to allow time for the plasma gas or emitting head 26 to cool, it is possible to shorten the time until plasma processing is started.

Note that, controller 150 may adjust reference length L1 not only when the temperature of the plasma gas exceeds the allowable temperature, but also when the plasma gas does not reach the allowable temperature. For example, controller 150 may shorten reference length L1 while measuring the temperature of the plasma gas to determine whether the temperature of the plasma gas has reached an allowable temperature. As a result, by shortening reference distance L1, the temperature of the plasma gas applied to target object 36 can more quickly reach the allowable temperature. As a result, it is possible to shorten the time required to start the plasma processing by shortening the warmup operation time.

Further, controller 150 controls the temperature of heater 115 based on the temperature detected by second temperature sensor 117. Therefore, during warmup operation, the temperature of heater 115, that is, the temperature of the heated gas, can be adjusted to adjust the temperature of the plasma gas. For example, when the temperature of the plasma gas is measured, controller 150 may perform control for increasing the temperature of heater 115 based on the temperature of the plasma gas detected by temperature sensor 48 to accelerate the temperature rise of the plasma gas. Alternatively, if the temperature of the plasma gas exceeds the allowable temperature, the temperature of the plasma gas may be adjusted by lowering the temperature of heater 115 based on the temperature of the plasma gas detected by temperature sensor 48. As a result, controller 150 can adjust the temperature of the plasma gas more quickly by adjusting the temperature of heater 115 separately from or in addition to the adjusting operation of reference length L1.

Above, descriptions are given of warmup operation when starting plasma processing after starting the system or when starting the plasma processing from normal mode, but the temperature of the plasma gas is also measured in a similar manner during warmup operation before starting plasma processing from the standby mode. In the standby mode, for example, after the stop button is operated, the supply of electric power to electrodes 74 and 76, and the supply of processing gas from processing gas supply device 103 are stopped, while the supply of heated gas from heated gas emitting device 63 is continued. As a result, reaction chamber 88 and the like can be heated by heater 115 and the heated gases. Therefore, while the consumption of heated gas can be suppressed in the normal mode, warmup operation time can be shortened and plasma processing can be started more quickly in the standby mode.

Display device 158 includes, for example, a selection button for selecting an operation mode of either a normal mode or a standby mode, wherein the selection button is operated to input an operation signal to controller 150. Further, the operating mode of plasma generation system 10 is set to the operating mode corresponding to the operation signal, that is, to either the normal mode or the standby mode selected by the operation of the selection button.

Here, in the standby mode, main housing 80 and reaction chamber 88 are warmed by heater 115 and the heated gases, but reaction chamber 88 and heater 115 are not in direct contact, and the temperature of reaction chamber 88 may decrease as the duration of the standby mode increases. Therefore, prior to starting plasma processing from the standby mode, controller 150 of the present embodiment measures the temperature of the plasma gas using temperature measuring device 28 and determines whether the temperature is acceptable in a similar manner to the warmup operation described above. Thereby, it is possible to start plasma processing after confirming more reliably that the temperature of the plasma gas applied to target object 36 is the allowable temperature.

The embodiment described in detail above has the following effects. According to plasma generation system 10 of the present embodiment, prior to plasma processing, emitting head 26 is moved to the position of temperature sensor 48, and plasma gas is emitted from emitting head 26 toward temperature sensor 48 and the temperature is measured. As a result, even when the room temperature or the like changes in accordance with the environment in which plasma generation system 10 is used, the actual temperature of the plasma gas applied to target object 36 can be measured more accurately.

Note that, the present application is not limited to the above-mentioned embodiments, and various modifications and changes can be made within a range not departing from the spirit of the present application. For example, plasma generation system 10 includes moving device 24 and control device 29 in addition to emitting head 26 and temperature sensor 48, but the configuration is not limited to this. Plasma generation system 10 may be configured to include only emitting head 26 and temperature sensor 48. Further, although not specifically mentioned in the above embodiment, the amounts of the processing gas and the heated gas may be changed between the time of measuring the temperature of the plasma gas and the time of performing the plasma processing on target object 36. Also, the electrodes of the present application are not limited to the pair of electrodes 74 and 76, and may be multiple of other electrodes.

REFERENCE SIGNS LIST

10: plasma generation system;
24: moving device;
26: emitting head;
29: control device;
36: target object;
48: temperature sensor;
74, 76: electrode;
88: reaction chamber;
98: emission port;
115: heater;
117: second temperature sensor;
L1: reference distance

The invention claimed is:

1. A plasma generation system comprising:
an emitting head configured to generate plasma gas by supplying power to electrodes provided in a reaction chamber to generate a plasma gas by converting a processing gas into plasma, and apply the generated plasma gas to a target object; and
a temperature sensor configured to detect a temperature of the plasma gas and output a detection signal corresponding to the detected temperature,
wherein
the temperature sensor is arranged at a position separated from an emission port of the emitting head from which the plasma gas is emitted and the plasma gas is emitted from the emission port to the temperature sensor, and
the emitting head is configured to be movable between the target object and the temperature sensor.

2. The plasma generation system according to claim 1, further comprising:
a moving device configured to move the emitting head; and
a control device configured to receive the detection signal outputted from the temperature sensor,
wherein
the control device is configured to perform
detection processing of controlling the moving device to move the emitting head to a position of the temperature sensor, and emitting the plasma gas to the temperature sensor such that the temperature is detected, and
application processing of controlling the moving device to move the emitting head to a position of the target object so as to apply the plasma gas to the target object.

3. The plasma generation system according to claim 2, wherein
the control device is configured to, in the detection processing, set a distance between the temperature sensor and the emitting head to a reference distance which is a distance based on a distance between the target object and the emitting head in the application processing, so as to detect the temperature.

4. The plasma generation system according to claim 2, wherein
the control device is configured to, during the detection processing, move the emitting head to the position of the target object in response to a determination that the temperature of the plasma gas has reached an allowable temperature, and perform the application processing.

5. The plasma generation system according to claim 2, wherein the control device is configured to, during the detection processing, adjust the temperature of the plasma gas to an allowable temperature by increasing the distance between the emitting head and the temperature sensor in response to the temperature of the plasma gas exceeding the allowable temperature, and, during the application processing, change the distance between the target object and the emitting head to the adjusted distance and apply the plasma gas to the target object.

6. The plasma generation system according to claim 2, wherein the emitting head includes a heater configured to heat a heating gas and a second temperature sensor configured to output a second detection signal corresponding to a temperature detected by detecting a temperature of the heater, and the heated gas heated by the heater is ejected toward the target object, and the control device is configured to receive the second detection signal and control a temperature of the heater based on a temperature detected by the temperature sensor.

\* \* \* \* \*